United States Patent
Cao et al.

(10) Patent No.: US 9,804,463 B2
(45) Date of Patent: Oct. 31, 2017

(54) ARRAY SUBSTRATE AND FABRICATION METHOD THEREOF AND DISPLAY DEVICE

(71) Applicant: BOE TECHNOLOGY GROUP CO., LTD., Beijing (CN)

(72) Inventors: Zhanfeng Cao, Beijing (CN); Xiaoyang Tong, Beijing (CN); Qi Yao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 585 days.

(21) Appl. No.: 14/126,941

(22) PCT Filed: Dec. 21, 2012

(86) PCT No.: PCT/CN2012/087124
§ 371 (c)(1),
(2) Date: Dec. 17, 2013

(87) PCT Pub. No.: WO2014/015631
PCT Pub. Date: Jan. 30, 2014

(65) Prior Publication Data
US 2015/0370109 A1 Dec. 24, 2015

(30) Foreign Application Priority Data
Jul. 26, 2012 (CN) .......................... 2012 1 0262902

(51) Int. Cl.
*G02F 1/1368* (2006.01)
*H01L 29/417* (2006.01)
(Continued)

(52) U.S. Cl.
CPC .......... *G02F 1/1368* (2013.01); *G02F 1/1362* (2013.01); *H01L 27/124* (2013.01);
(Continued)

(58) Field of Classification Search
CPC ..... H01L 29/417; H01L 29/789; H01L 27/12; G02F 1/1368
(Continued)

(56) References Cited

U.S. PATENT DOCUMENTS

2004/0109098 A1* 6/2004 Kim .................. G02F 1/133514
349/38
2007/0238218 A1* 10/2007 Teng ..................... H01L 27/322
438/99
(Continued)

FOREIGN PATENT DOCUMENTS

CN 101577283 A 11/2009
CN 101609238 A 12/2009
(Continued)

OTHER PUBLICATIONS

English translation of Chinese Patent No. 101577283, 47pgs.
(Continued)

*Primary Examiner* — Mohsen Ahmadi
*Assistant Examiner* — Young W Kim
(74) *Attorney, Agent, or Firm* — Ladas & Parry LLP

(57) ABSTRACT

Embodiments of the invention provide an array substrate and a fabrication method thereof and a display device. The fabrication method of an array substrate includes: forming a semiconductor active layer, a gate insulating layer and a gate electrode on a substrate; forming a light-shielding layer; forming a first color filter layer, forming a second color filter layer and forming a third color filter layer; and forming via holes that respectively penetrate through the first color filter layer, the second color filter layer and the third color filter layers; and forming a pixel electrode and source and drain electrodes.

9 Claims, 8 Drawing Sheets

(51) Int. Cl.
*G02F 1/1362* (2006.01)
*H01L 27/12* (2006.01)
*H01L 29/786* (2006.01)

(52) U.S. Cl.
CPC ...... *H01L 27/1248* (2013.01); *H01L 27/1288* (2013.01); *H01L 29/41733* (2013.01); *H01L 29/78633* (2013.01); *G02F 1/136227* (2013.01); *G02F 2001/136222* (2013.01)

(58) Field of Classification Search
USPC .............. 438/99, 151, 166; 257/347; 349/38
See application file for complete search history.

(56) References Cited

U.S. PATENT DOCUMENTS

| | | | | |
|---|---|---|---|---|
| 2009/0195735 | A1* | 8/2009 | Huang | G02F 1/13394 349/106 |
| 2009/0278131 | A1 | 11/2009 | Kwon et al. | |
| 2010/0112773 | A1 | 5/2010 | Ting | |
| 2010/0208153 | A1 | 8/2010 | Liu | |
| 2012/0171822 | A1* | 7/2012 | Yuan | H01L 21/0274 438/166 |

FOREIGN PATENT DOCUMENTS

| | | |
|---|---|---|
| CN | 101634789 A | 1/2010 |
| CN | 101807583 A | 8/2010 |
| CN | 102543860 A | 7/2012 |
| CN | 102800630 A | 11/2012 |
| KR | 10-2006-0082315 | 7/2006 |

OTHER PUBLICATIONS

English translation of Chinese Patent No. 101609238, 17pgs.
English translation of Chinese Patent No. 101634789, 68pgs.
English translation of Chinese Patent No. 101807583, 30pgs.
English translation of Chinese Patent No. 102543860, 26pgs.
English translation of Chinese Patent No. 102800630, 28pgs.
First Office Action issued by the Chinese Patent Office for Chinese Patent Application No. 201210262902.3 dated Jan. 21, 2014, 7pgs.
English translation of First Office Action issued by the Chinese Patent Office for Chinese Patent Application No. 201210262902.3 dated Jan. 21, 2014, 7pgs.
International Search Report for International Application No. PCT/CN2012/087124, 13pgs.
International Preliminary Report on Patentability for International Application No. PCT/CN2012/087124 dated Jan. 27, 2015, twelve (12) pages.
Notification of Reexamination issued by the Chinese Patent Office for Chinese Patent Application No. 201210262902.3 dated Mar. 17, 2015, 8pgs.
English translation of Notification of Reexamination issued by the Chinese Patent Office for Chinese Patent Application No. 201210262902.3 dated Aug. 6, 2014, 8pgs.
Rejection Decision issued by the Chinese Patent Office for Chinese Patent Application No. 201210262902.3 dated Aug. 6, 2014, 5pgs.
English translation of Rejection Decision issued by the Chinese Patent Office for Chinese Patent Application No. 201210262902.3 dated Aug. 6, 2014, 8pgs.

* cited by examiner

ARRAY SUBSTRATE AND FABRICATION METHOD THEREOF AND DISPLAY DEVICE

CROSS REFERENCE TO RELATED APPLICATIONS

This application is based on International Application No. PCT/CN2012/087124 filed on Dec. 21, 2012, which claims priority to Chinese National Application No. 201210262902.3 filed on Jul. 26, 2012, the contents of which are incorporated herein by reference.

TECHNICAL FIELD

Embodiments of the invention relate to an array substrate and a fabrication method thereof and a display device.

BACKGROUND

A conventional TFT-LCD (Thin Film Transistor-Liquid Crystal Display) is formed by assembling a TFT array substrate and a color filter substrate.

Recently, a Color Filter On Array (COA) technology, in which a color filter layer is formed on the array substrate after the completion of the TFT array fabrication, is developed. That is to say, in the COA technology, the color filter layer is formed on the array substrate. Because of accurate wiring, it is not necessary to increase a width of a light-shielding layer in view of cell-assembling process in the COA technology, so that a higher transmittance can be obtained. The COA technology, in which the color filter layer is integrated into the array substrate, has attracted more and more attentions because its advantages of lower fabricating cost, smaller thickness, smaller weight and the like.

However, the conventional COA technology requires many masks, resulted in complicated fabrication process, high cost, and difficult to guarantee the product quality for complicated fabrication process.

SUMMARY

One aspect of the embodiments of the invention provides a fabrication method of an array substrate. The method including: forming a semiconductor active layer, a gate insulating layer and a gate electrode on a substrate; forming a light-shielding layer; forming a first color filter layer and forming a second color filter layer; forming a third color filter layer and forming via holes that respectively penetrate through the first color filter layer, the second color filter layer and the third color filter layers; and forming a pixel electrode and source and drain electrodes In an example, forming a semiconductor active layer, a gate insulating layer and a gate electrode on a substrate includes: forming a semiconductor active layer film, a gate insulating layer film and a gate metal layer film sequentially on the substrate; coating a photoresist, and forming a first photoresist-completely-reserved region, a first photoresist-partially-reserved region and a first photoresist-completely-removed region through exposure and development with a mask, wherein the first photoresist-completely-reserved region corresponds to a region of the gate electrode, the first photoresist-partially-reserved region corresponds to a region of the semiconductor active layer, and the first photoresist-completely-removed region corresponds to a region other than the regions of the gate electrode and the semiconductor active layer; removing the gate metal layer film, the gate insulating layer film and the semiconductor active layer film in the first photoresist-completely-removed region through an etching process; performing an ashing process to remove the photoresist in the first photoresist-partially-reserved region; removing portions of the gate metal layer film and the gate insulting layer film that are provided on the semiconductor active layer through an etching process; and stripping off the photoresist.

In an example, the method further including: forming a first protective layer on the substrate formed with the semiconductor active layer, the gate insulating layer and the gate electrode, wherein the via holes further penetrate through the first protective layer.

In an example, forming a first protective layer and forming a light-shielding layer include: forming a first protective layer film on the substrate formed with the semiconductor active layer, the gate insulating layer and the gate electrode; forming a black light-shielding material film; coating a photoresist, and forming a second photoresist-completely-reserved region and a second photoresist-completely-removed region through exposure and development with a mask, wherein the second photoresist-completely-reserved region corresponds to a region of the gate electrode, and a region other than the second photoresist-completely-reserved region corresponds to the second photoresist-completely-removed region; removing the black light-shielding material film in the second photoresist-completely-removed region through an etching process; and stripping off the photoresist.

In an example, forming via holes includes: coating a photoresist on the third color filter layer, and forming a third photoresist-completely-reserved region and a third photoresist-completely-removed region through exposure and development with a mask, wherein the third photoresist-completely-removed region corresponds to regions on both sides of the gate electrode and above the semiconductor active layer where the via holes are to be formed, and the third photoresist-completely-reserved region corresponds to a region above the third color filter layer other than the region where the via holes are to be formed; removing the third color filter layer, the first color filter layer, the second color filter layer and the first protective layer in the third photoresist-completely-removed region through an etching process; and stripping the photoresist.

In an example, forming a pixel electrode and source and drain electrodes includes: depositing a pixel electrode layer; depositing a source and drain metal layer; coating a photoresist, and forming a fourth photoresist-completely-reserved region, a fourth photoresist-partially-reserved region and a fourth photoresist-completely-removed region through exposure and development with a dual-tone mask, wherein the fourth photoresist-completely-reserved region corresponds to the via holes, the photoresist-partially-reserved region corresponds to a region of a portion of each of the first to third color filter layers that is not formed above the semiconductor active layer, the fourth photoresist-completely-removed region corresponds to a region of another portion of each of the first to third color filter layers that is not formed above the semiconductor active layer and a region in which the gate electrode, the gate insulating layer and the color filter layer are formed; removing the pixel electrode layer and the source and drain metal layer in the fourth photoresist-completely-removed region through an etching process; performing an ashing process to remove the photoresist in the fourth photoresist-partially-reserved region; removing the source and drain metal layer in the region of the portion of each of the first to third color filter layers that is not formed above the semiconductor active layer through an etching process; and stripping off the photoresist.

Another aspect of the embodiments of the invention provides an array substrate, including: a substrate; a semiconductor active layer, a gate insulating layer, and a gate electrode formed on the substrate; a light-shielding layer, a first color filter layer, a second color filter layer, and a third color filter layer formed on the semiconductor active layer, the gate insulating layer and the gate electrode, wherein via holes that respectively penetrate through the first color filter layer, the second color filter layer and the third color filter layer are formed; a pixel electrode and source and drain electrodes respectively formed on the first color filter layer, the second color filter layer and the third color filter layer, wherein the source and drain electrodes electrically connected to the semiconductor active layer through the via holes.

In an example, the gate electrode is disposed on the gate insulating layer, and a pattern of the gate electrode is as same as a pattern of the gate insulating layer.

In an example, the light-shielding layer is disposed above the gate electrode.

In an example, the source and drain electrodes are electrically connected to the semiconductor active layer through a layer for the pixel electrode and the via holes.

In an example, the array substrate further includes a first protective layer formed on the semiconductor active layer, the gate insulating layer and the gate electrode.

Yet another aspect of the embodiments of the invention provides a display device, including the array substrate fabricated by the aforesaid fabrication method of the array substrate.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, the technical terms or scientific terms used here are common sense that one ordinarily skilled in the art can understand. In the description and claims of the invention, the "first", "second" and other similar words do not mean any sequence, quantity or importance, but are merely used to distinguish between different composite parts. Similarly, words like "one" or "a" does not mean the limits of quantity, but indicates the presence of at least one. Words like "include" or "comprise" mean elements or items before the words "include" or "comprise" cover elements or items and equivalents listed after the words, and do not exclude other elements or items. Words like "connect" or "connect with each other" are not limited to physical or mechanical connections, but also electrical connections, either directly or indirectly. Words like "up", "down", "left" and "right" are only used to refer to relative positional relationship, so when the described item changes its absolute position, the relative positional relationship may change correspondingly.

An array substrate according to an embodiment of the invention includes a plurality of gate lines and a plurality of data lines, which are intersected with each other and thereby define a plurality of pixel regions arranged in matrix. Each pixel region includes a thin film transistor as a switching element and a pixel electrode for controlling the arrangement of liquid crystal. For example, the thin film transistor of each pixel region has a gate electrode electrically connected to or integrated with the corresponding gate line, a source electrode electrically connected to or integrated with the corresponding data line, and a drain electrode electrically connected to or integrated with the corresponding pixel electrode. The following description is mainly given for one single pixel region or several pixel regions, but the other pixel regions can be formed in a similar way.

Figure 15:
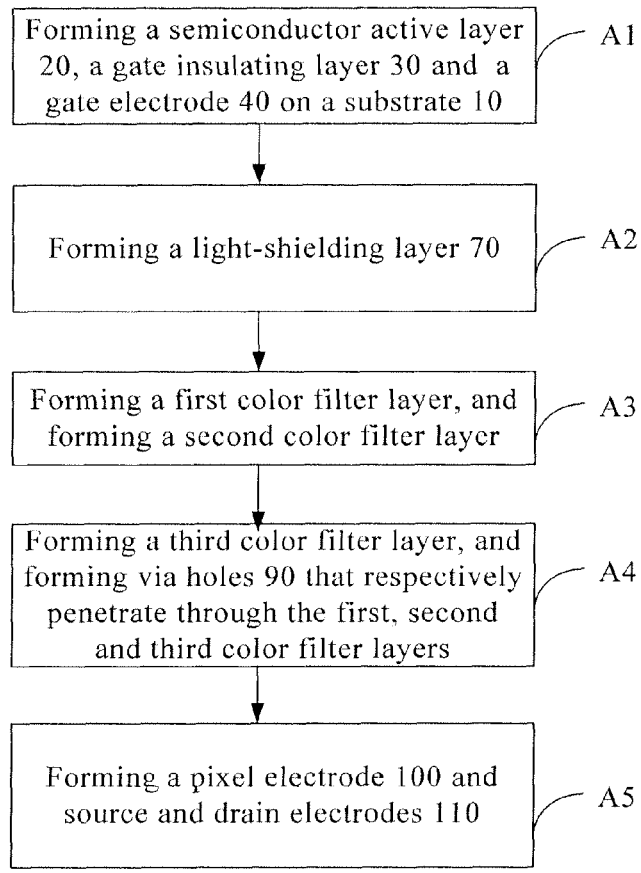
FIG. 15 is a flow chart of fabricating an array substrate according to an embodiment of the invention.

An embodiment of the invention provides a fabrication method of an array substrate 1. As shown in FIG. 15, the method includes the following steps.

A1: forming an active layer 20, a gate insulating layer 30, and a gate electrode 40 on a substrate 10.

Figure 1:
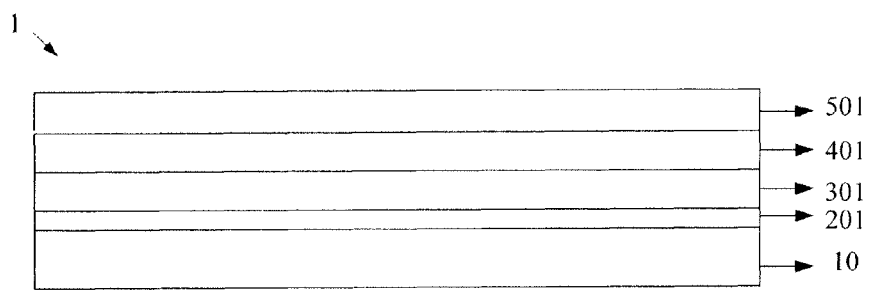
FIGS. 1 to 13 are schematic diagrams illustrating a process of fabricating an array substrate according to an embodiments of the invention.

As shown in FIG. 1, a semiconductor active layer film 201, a gate insulating layer film 301, and a gate metal layer film 401 are formed on the substrate 10 sequentially by using, for example, chemical vapor deposition or thermal evaporation. For example, the semiconductor active layer film 201 is first deposited; then one of silicon nitride, silicon oxide and silicon oxynitride is deposited to form the gate insulating layer film 301; and then one of the metal materials such as molybdenum, copper (the metal materials is used for forming the gate line and the gate electrode) is deposited to form the gate metal layer film 401.

Then, a photoresist 501 is coated on the gate metal layer film 401.

Figure 2:
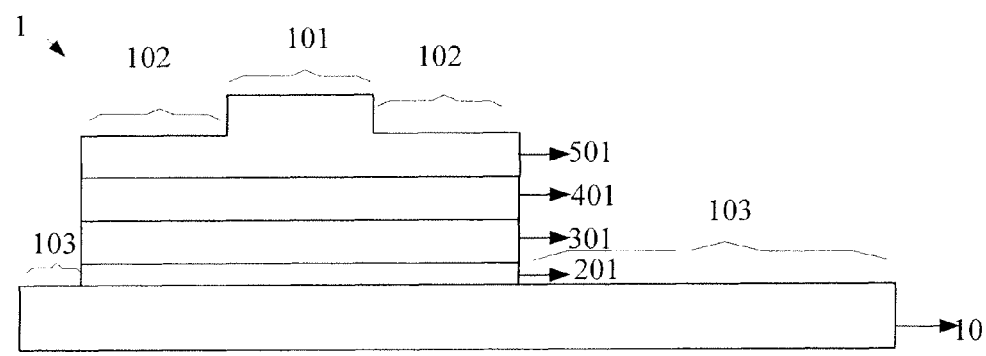

As shown in FIG. 2, after coating the photoresist 501, an exposure is performed with a dual-tone mask. The dual-tone mask may be a gray-tone mask or a half-tone mask. For example, a first photoresist-completely-reserved region 101, a first photoresist-partially-reserved region 102, and a first photoresist-completely-removed region 103 are formed through exposure and development with the halftone mask. The first photoresist-completely-reserved region 101 corresponds to a region of the gate electrode 40, the first photoresist-partially-reserved region 102 corresponds to a region of the semiconductor active layer 20, and the first photoresist-completely-removed region 103 corresponds to a region other than the regions of the gate electrode 40 and the semiconductor active layer 20. Then, an etching is performed to remove the gate metal layer film, the gate insulating layer film and the semiconductor active layer film in the first photoresist-completely-removed region 103.

Figure 3:
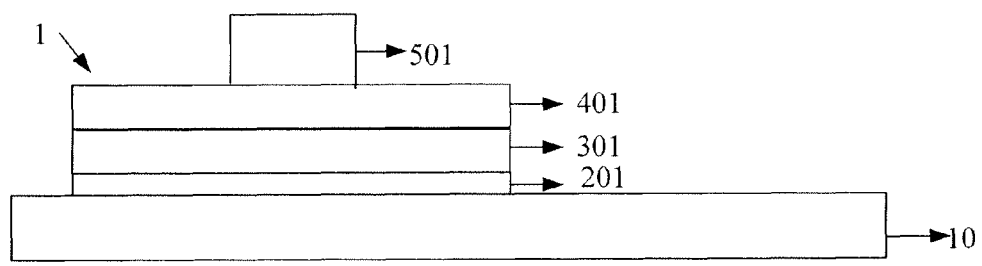

As shown in FIG. 3, an ashing process is performed on the photoresist 501, and the photoresist in the first photoresist-partially-reserved region 102 is removed, and meanwhile a thickness of the photoresist in first photoresist-completely-reserved region 101 is reduced. Because the first photoresist-completely-reserved region 101 is also affected by the ashing process, the photoresist in this region is thinned.

Figure 4:
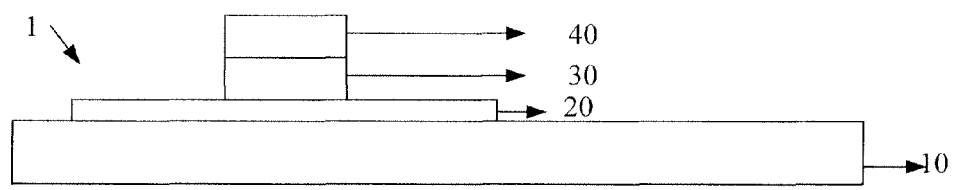

As shown in FIG. 4, the gate metal layer film 401 and the gate insulating layer film 301 in the first photoresist-partially-reserved region 102 are removed through an etching process. Then the photoresist 501 in the first photoresist-completely-reserved region 101 is stripped off, thereby the semiconductor active layer 20, the gate insulating layer 30 and the gate electrode 40 are formed.

A2: forming a light-shielding layer 70 on the substrate formed with the semiconductor active layer 20, the gate insulating layer 30 and the gate electrode 40.

Furthermore, a first protective layer and the light-shielding layer may be both formed on the substrate formed with the semiconductor active layer 20, the gate insulating layer 30 and the gate electrode 40. The embodiment is described by taking the formation of both the first protective layer and the light-shielding layer as an example, but the fabrication method of the array substrate without forming the first protective layer is also within the protection scope of the invention.

Figure 5:
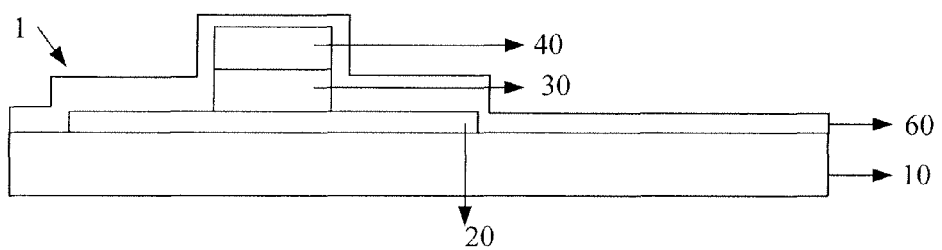

For example, as shown in FIG. 5, the first protective layer 60 is formed on the semiconductor active layer 20, the gate insulating layer 30, and the gate electrode 40.

Figure 6:
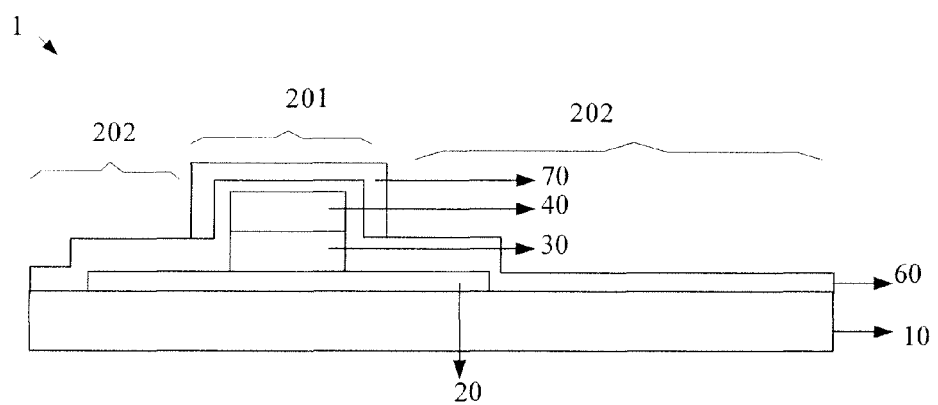

As shown in FIG. 6, the first protective layer 60 is formed, and then a black light-shielding material film is formed on the substrate formed with the first protective layer 60. Then, a photoresist is coated on the black light-shielding material film, and a second photoresist-completely-reserved region 201 and a second photoresist-completely-removed region 202 are formed through exposure and development with a mask. The second photoresist-completely-reserved region 201 corresponds to the region of the gate electrode 40, and the region other than the second photoresist-completely-reserved region 201 corresponds to the second photoresist-completely-removed region 202. The black light-shielding material film is etched to remove the black light-shielding material film in the second photoresist-completely-removed region 202, and finally the photoresist is stripped off. As a result, a black matrix is formed above the gate electrode 40, that is to say, the light-shielding layer 70 is formed above the gate electrode 40.

Figure 8:
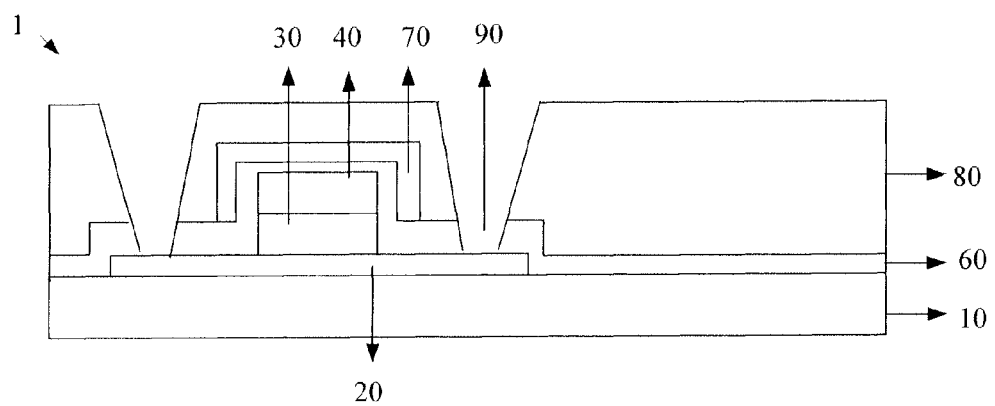
Figure 8A:
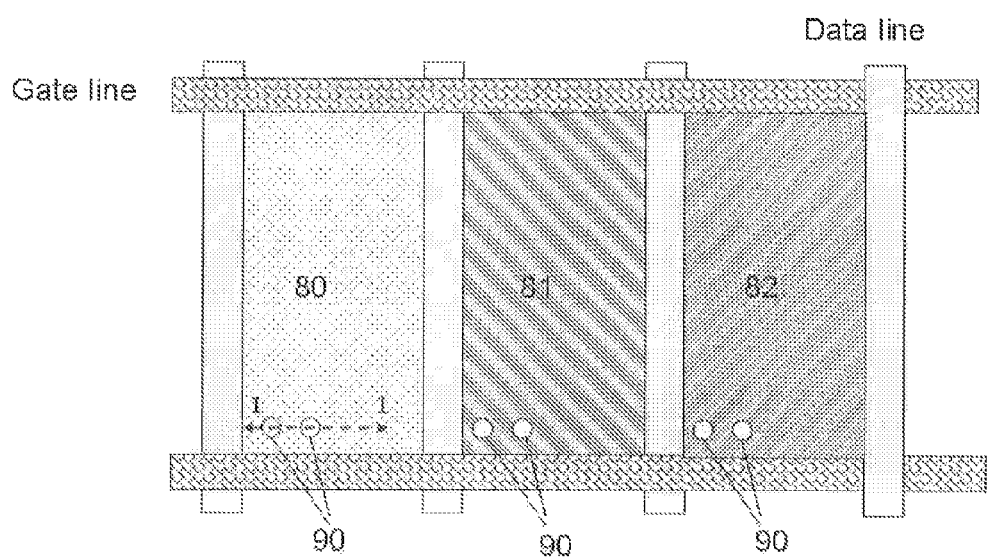

A3: forming a first color filter layer 81 and a second color filter layer 82 (as shown in FIG. 8A) on the substrate formed with the light-shielding layer 70.

A4: forming a third color filter layer 80 on the substrate formed with the first color filter layer 81 and the second color filter layer 82, and forming via holes 90 that penetrate through the first to third color filter layers respectively.

It should be noted that the colors of the first color filter layer 81, the second color filter layer 82 and the third color filter layer 80 are not limited. The first color filter layer 81 may be red, the second color filter layer 82 may be green, and the third color filter layer 80 may be blue. In addition, the first color filter layer 81 may be green, blue or other primary color, the second color filter layer 82 may be blue, red or other primary color, and the third color filter layer 80 may be red, green or other primary color. Each color filter layer corresponds to one pixel region. Each group of color filter layers includes one first color filter layer, one second color filter layer, and one third color filter layer, and each group of color filter layers corresponds to three adjacent pixel regions. The array substrate may comprise a plurality of the first color filter layers, a plurality of the second color filter layers, and a plurality of the third color filter layers. For example, the first color filter layer is red, and the pixel region that the red color filter layer corresponds to is called as a red pixel region. Similarly, other pixel regions may be called as green pixel regions or blue pixel regions. The order of the color filter layers in each group of color filter layers is not limited.

Figure 7:
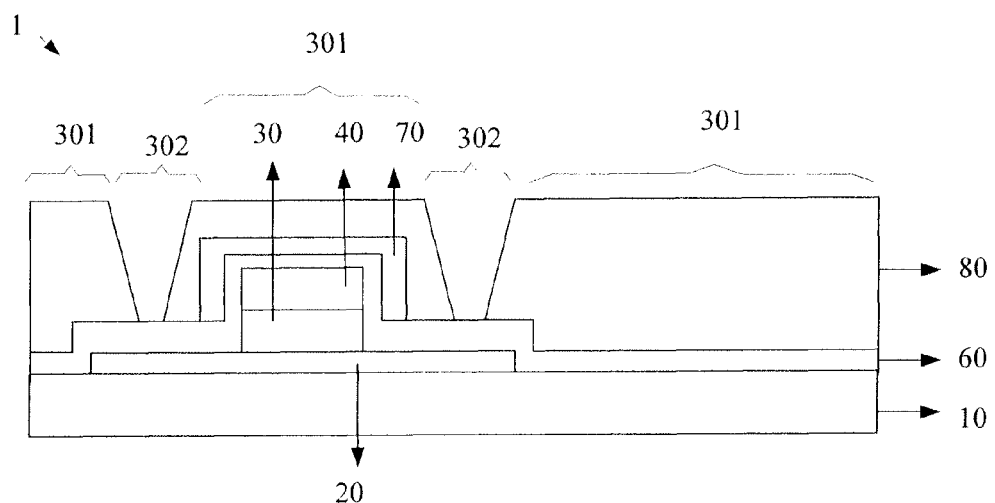

For example, as shown in FIG. 7, FIG. 8, and FIG 8A, the blue color filter layer 80 is formed on the substrate formed with the red and green color filter layers, and then via holes 90 are formed above the semiconductor active layer 20. For example, a photoresist is coated (not shown) on the color filter layers, and a third photoresist-completely-reserved region 301 and a third photoresist-completely-removed region 302 are formed after exposure and development with a mask. The third photoresist-completely-removed region 302 corresponds to the regions on both sides of the gate electrode 40 and above the semiconductor active layer 20 where the via holes 90 are to be formed, and the third photoresist-completely-reserved region 301 corresponds to the region other than the third photoresist-completely-removed region 302. Then, an etching is performed to remove the blue color filter layer, the red color filter layer, and the green color filter layer in the third photoresist-completely-removed region 302, thereby the via holes 90 that penetrate through the red, green and blue color filter layers respectively are formed. Further, if the first protective layer 60 is formed in step A2, the red color filter layer, the green color filter layer, and the blue color filter layer 80 as well as the first protective layer 60 are removed in the third photoresist-completely-removed region 302 to form the via holes 90 that penetrate through the red color filter layer, the green color filter layer, the blue color filter layer 80 and the first protective layer 60.

After the above steps, the first color filter layer and the second color filter layer are formed, and the third color filter layer and the via holes that penetrate through the color filter layers respectively are formed on the substrate formed with the first color filter layer and the second color filter layer.

Further, each of the color filter layers may be made of a color photosensitive resin, and in this case, the via holes that respectively penetrate through the color filter layers may be formed directly through exposure and development when the first, second, and third color filter layers are formed, thereby the fabrication process can be simplified. If the first protective layer is formed in step A2, the blue, red, and green color filter layers in the third photoresist-completely-removed region 302 are removed through development, and the first protective layer in the third photoresist-completely-removed region 302 is removed through etching, so that the via holes 90 that penetrate through the color filter layers and the first protective layer are formed.

A5: forming a pixel electrode layer 101 and a source and drain metal layer 111 on the substrate formed with the first color filter layer, the second color filter layer, the third color filter layer 80 and the via holes 90 that respectively penetrate through the color filter layers.

Further, if the first protective layer 60 is formed, then the pixel electrode layer 101 and the source and drain metal layer 111 are formed on the substrate formed with the first color filter layer, the second color filter layer, the third color filter layer 80 and the via holes 90 that penetrate through the color filter layers as well as the first protective layer 60.

Figure 9:
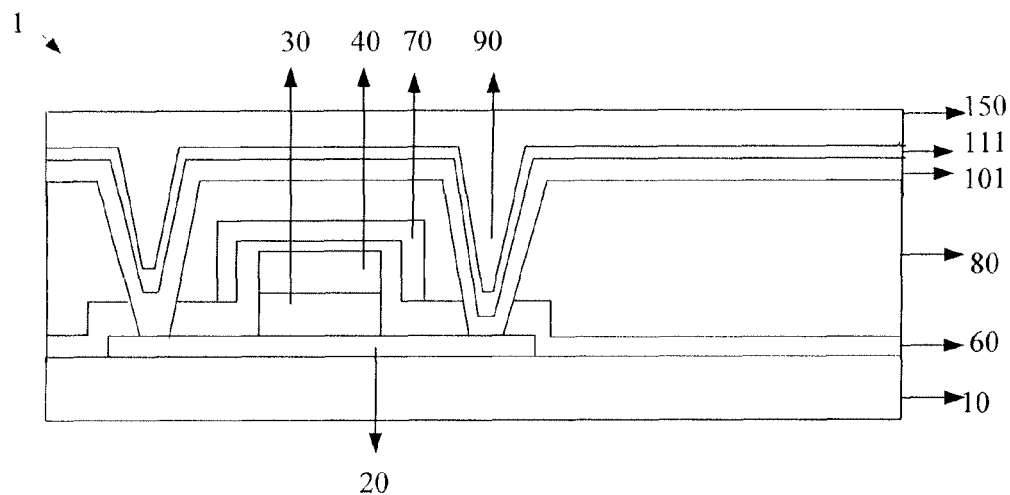
Figure 10:
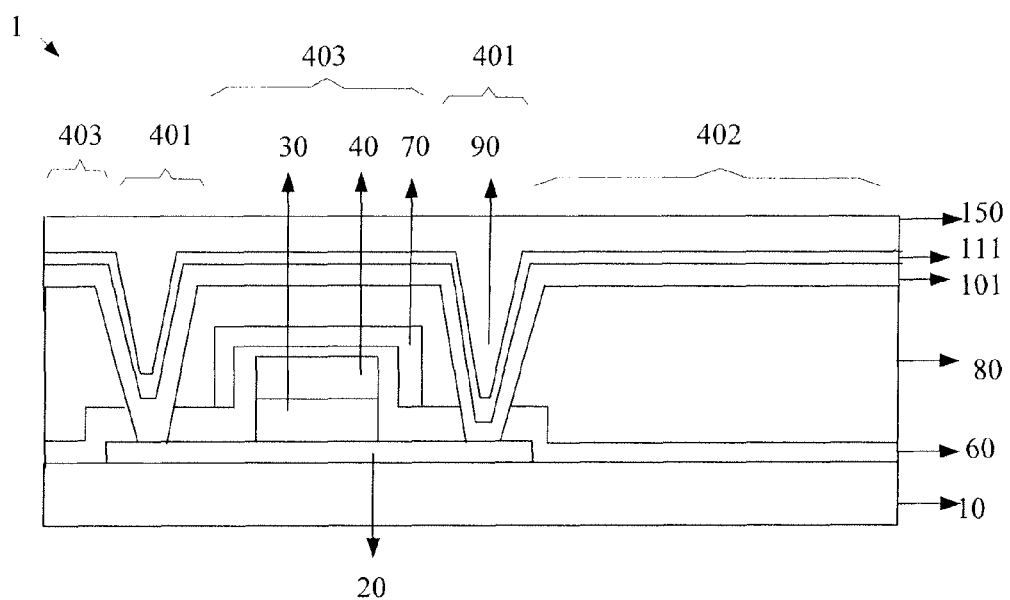
Figure 11:
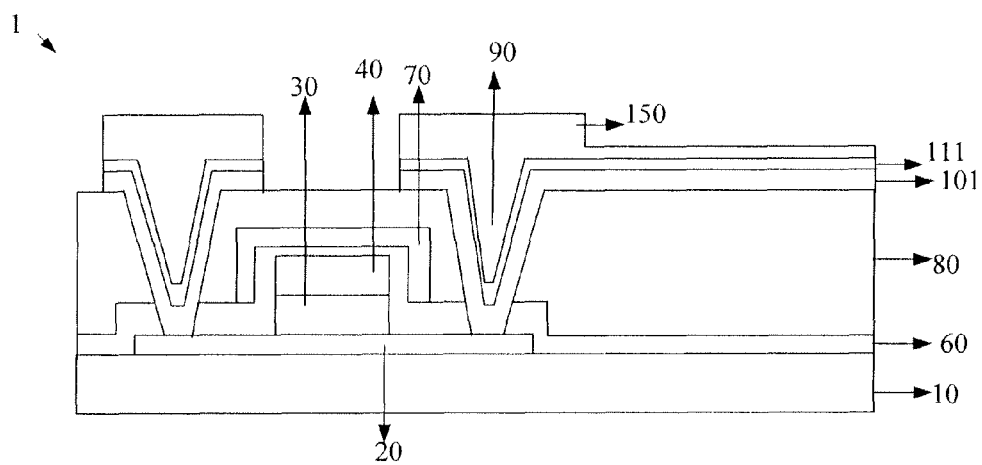
Figure 12:
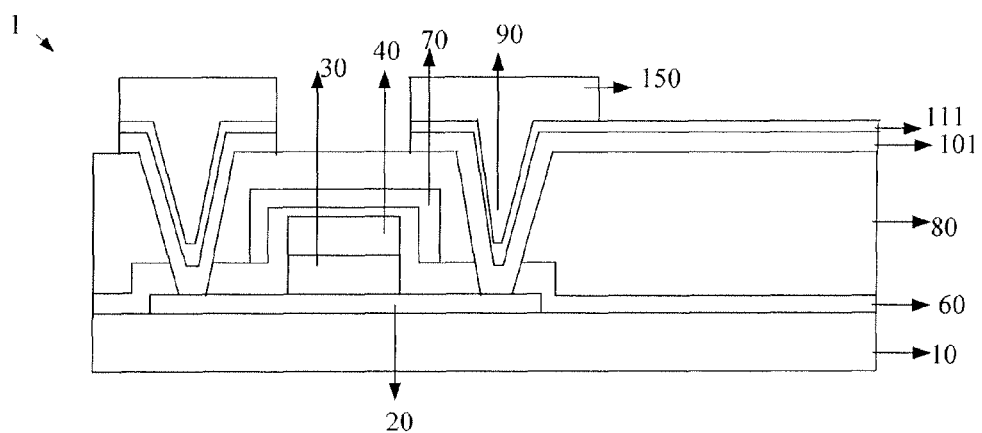
Figure 13:
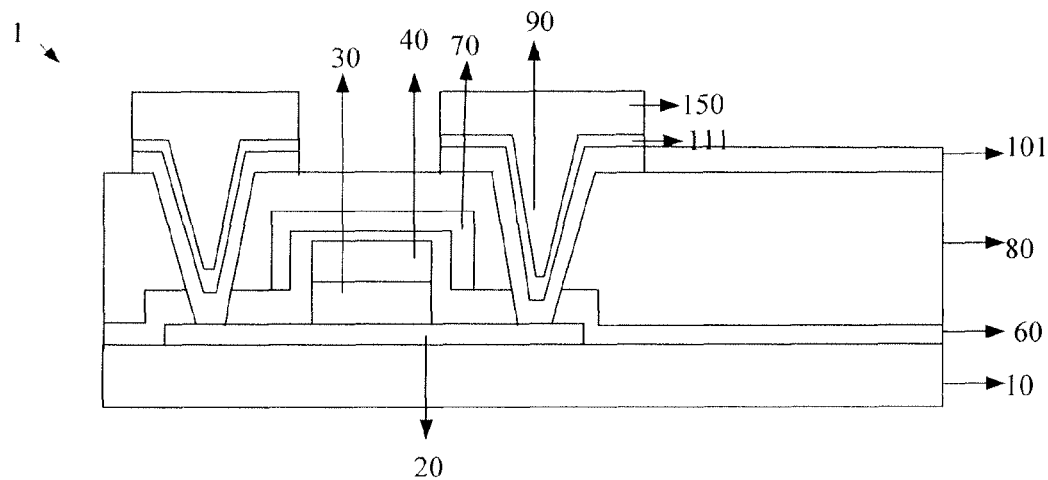

For example, as shown in FIG. 9, the pixel electrode layer 101 is first deposited on the substrate formed with the first color filter layer, the second color filter layer, the third color filter layer 80 and the via holes 90 that penetrate through the color filter layers as well as the first protective layer 60. Next, the source and drain metal layer 111 is deposited on the pixel electrode layer 101, and then a photoresist 150 is coated on the source and drain metal layer 111. After exposure and development with a dual-tone mask (e.g., a halftone mask), a fourth photoresist-completely-reserved region 401, a fourth photoresist-partially-reserved region 402, and a fourth photoresist-completely-removed region 403 are formed. The fourth photoresist-completely-reserved region 401 corresponds to the via holes 90, the photoresist-partially-reserved region 402 corresponds to a region of a portion of each of the color filter layers that is not formed above the semiconductor active layer 20 (as shown in FIG. 10, the photoresist-partially-reserved region 402 corresponds to a region of a portion of each of the color filter layers that is on the right side of the right via hole), the fourth photoresist-completely-removed region 403 corresponds to a channel region of the thin film transistor and the remaining regions (as shown in FIG. 10, the fourth photoresist-completely-removed region 403 corresponds to a region above the gate electrode 40 and a region of a portion of each of the color filter layers that is on the left side of the left via hole). That is to say, the fourth photoresist-completely-removed region 403 corresponds to a region of another portion of each of the color filter layers that is not formed above the semiconductor active layer 20 and a region in which the gate electrode, the gate insulating layer and the color filter layer are formed, as shown in FIG. 10.

As shown in FIG. 10, an etching is performed to remove the pixel electrode 101 and the source and drain metal layer 111 in the fourth photoresist-completely-removed region 403.

As shown in FIGS. 11-14, an ashing process is performed on the photoresist 150 to remove the photoresist 150 in the fourth photoresist-partially-reserved region 402, and in the meantime the photoresist 150 in the fourth photoresist-completely-reserved region 401 is thinned. Through etching process, the pixel electrode layer 101 in the fourth photoresist-partially-reserved region 402 is removed, and then the photoresist 150 is stripped off, so that the pixel electrode 100 and the source and drain electrodes 110 are formed.

The embodiment of the invention provides a fabrication method of an array substrate. When fabricating the array substrate, the semiconductor active layer, the gate insulating layer and the gate electrode are formed through one patterning process; each of the color filter layers are formed through one more patterning process; and the pixel electrode and the source and drain electrodes are formed through another patterning process. In comparison with the conventional technology, the fabrication method according to the embodiment of the invention can reduce the times of patterning process and simplify the fabrication process on the premise of achieving the function of the TFT array substrate, and at the same time, the quality of the array substrate and the display device including the array substrate in the COA technology can be ensured.

Figure 16:
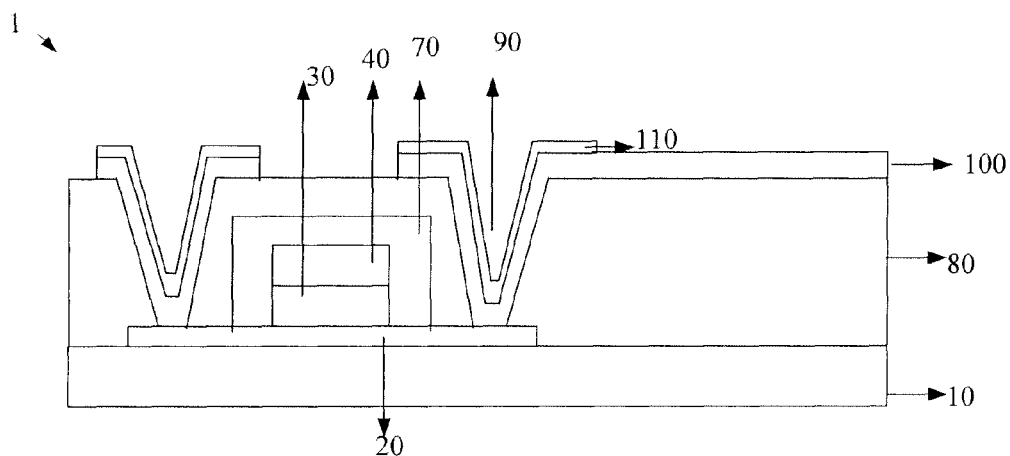
FIG. 16 is a structural schematic diagram illustrating an array substrate according to another embodiment of the invention.

Another embodiment of the invention provides an array substrate 1. As shown in FIG. 16, the array substrate 1 includes: a substrate 10; a semiconductor active layer 20, a gate insulating layer 30 and a gate electrode 40 formed on the substrate 10; a light-shielding layer 70 and a color filter layer 80 formed on the semiconductor active layer 20, the gate insulating layer 30 and the gate electrode 40; via holes 90 that penetrate through the color filter layer; a pixel electrode 100 and source and drain electrodes 110 formed on the color filter layer, wherein, the source and drain electrodes 110 are electrically connected to the semiconductor active layer 20 through the via holes 90 that penetrate through the color filter layer. For example, the source and drain electrodes 110 are electrically connected to the semiconductor active layer 20 through the pixel electrode layer and the via holes 90.

It should be noted that the color filter layer 80 is one of a first color filter layer, a second color filter layer and a third color filter layer, with each color filter layer corresponding to one pixel region. Each group of color filter layers includes the first color filter layer, the second color filter layer, and the third color filter layer, and each group of color filter layers corresponds to three adjacent pixel regions. The array substrate may include a plurality of first color filter layers, a plurality of second color filter layers and a plurality of third color filter layers. For example, on the array substrate, taking the first color filter layer being red as an example, the pixel region that the red color filter layer corresponds to is called as a red pixel region. Similarly, there are also a green pixel region and a blue pixel region. The red pixel region, the green pixel region and the blue pixel region are adjacent sequentially.

Furthermore, the gate electrode 40 is disposed on the gate insulating layer 30, and the pattern of the gate electrode 40 is as same as the pattern of the gate insulating layer 30. The light-shielding layer 70 is provided above the gate electrode 40.

Figure 14:
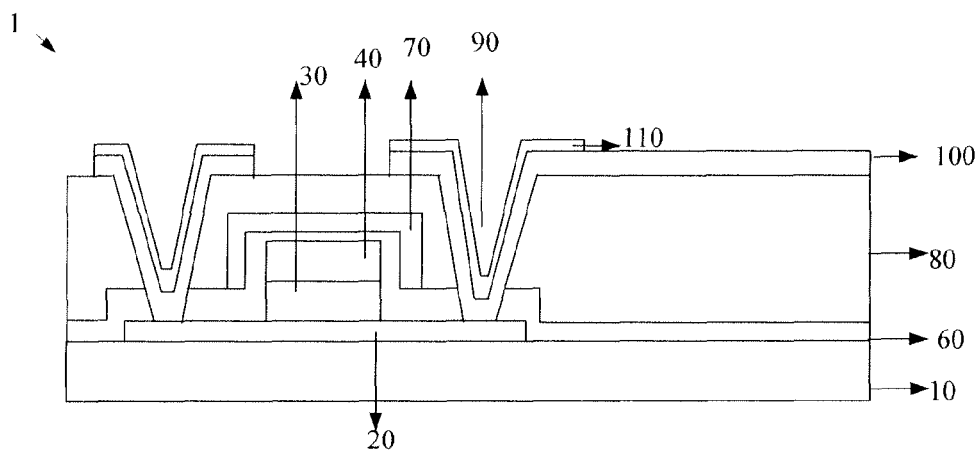
FIG. 14 is a structural schematic diagram illustrating array substrate according to an embodiment of the invention.

It should be noted that, as shown in FIG. 14, the array substrate 1 may further include the first protective layer 60 which is formed on the semiconductor active layer 20, the gate insulating layer 30 and the gate electrode 40.

The array substrate 1 according to the embodiment of the invention can integrate the color filter layer into the thin-film transistor array substrate. In this case, because of accurate wiring, it is not necessary to increase a width of a light-shielding layer in view of cell-assembling process, so that a higher transmittance can be obtained. In addition, the array substrate 1 according to the embodiment of the invention can simplify the fabrication process and ensure the product quality.

In addition, an embodiment of the invention provides a display device, which includes the array substrate fabricated with the fabrication method described above. In the display device, the color filter layer can be integrated into the array substrate 1. For example, the display device may be a display formed by assembling the array substrate 1 and a transparent glass substrate, such as a liquid crystal display, an OLED display, an active electronic paper display, or other displays using the above-mentioned array substrate 1.

The display device according to the embodiment of the invention can integrate the color filter layer into the thin-film transistor array substrate. In this case, because of accurate wiring, it is not necessary to increase the width of the light-shielding layer in view of cell-assembling process, so that a higher transmittance can be obtained. In addition, the display device according to the embodiment of the invention can simplify the fabrication process and ensure the product quality.

The foregoing embodiments merely are exemplary embodiments of the invention, and not intended to define the scope of the invention, and the scope of the invention is determined by the appended claims.

What is claimed is:
1. A fabrication method of an array substrate, including:
forming a semiconductor active layer, a gate insulating layer and a gate electrode on a substrate;

forming a light-shielding layer;
forming a first color filter layer and forming a second color filter layer;
forming a third color filter layer and forming via holes that respectively penetrate through the first color filter layer, the second color filter layer and the third color filter layers; and
forming a pixel electrode and source and drain electrodes, wherein, forming via holes includes:
coating a photoresist on the third color filter layer, and forming a third photoresist-completely-reserved region and a third photoresist-completely-removed region through exposure and development with a mask, wherein the third photoresist-completely-removed region corresponds to regions on both sides of the gate electrode and above the semiconductor active layer where the via holes are to be formed, and the third photoresist-completely-reserved region corresponds to a region above the third color filter layer other than the region where the via holes are to be formed;
removing the third color filter layer, the first color filter layer and the second color filter layer in the third photoresist-completely-removed region through an etching process; and
stripping off the photoresist.

2. The fabrication method of the array substrate according to claim 1, wherein, forming a semiconductor active layer, a gate insulating layer and a gate electrode on a substrate includes:
forming a semiconductor active layer film, a gate insulating layer film and a gate metal layer film sequentially on the substrate;
coating a photoresist, and forming a first photoresist-completely-reserved region, a first photoresist-partially-reserved region and a first photoresist-completely-removed region through exposure and development with a mask, wherein the first photoresist-completely-reserved region corresponds to a region of the gate electrode, the first photoresist-partially-reserved region corresponds to a region of the semiconductor active layer, and the first photoresist-completely-removed region corresponds to a region other than the regions of the gate electrode and the semiconductor active layer;
removing the gate metal layer film, the gate insulating layer film and the semiconductor active layer film in the first photoresist-completely-removed region through an etching process;
performing an ashing process to remove the photoresist in the first photoresist-partially reserved region;
removing portions of the gate metal layer film and the gate insulting layer film that are provided on the semiconductor active layer through an etching process; and
stripping off the photoresist.

3. The fabrication method of the array substrate according to claim 1, further including:
forming a first protective layer on the substrate formed with the semiconductor active layer, the gate insulating layer and the gate electrode,
wherein the via holes further penetrate through the first protective layer.

4. The fabrication method of the array substrate according to claim 3, wherein, forming a first protective layer and forming a light-shielding layer include:
forming a first protective layer film on the substrate formed with the semiconductor active layer, the gate insulating layer and the gate electrode;
forming a black light-shielding material film;
coating a photoresist, and forming a second photoresist-completely-reserved region and a second photoresist-completely-removed region through exposure and development with a mask, wherein the second photoresist-completely-reserved region corresponds to a region of the gate electrode, and a region other than the second photoresist-completely-reserved region corresponds to the second photoresist-completely-removed region;
removing the black light-shielding material film in the second photoresist-completely-removed region through an etching process; and
stripping off the photoresist.

5. The fabrication method of the array substrate according to claim 4, wherein, forming via holes includes:
coating the photoresist on the third color filter layer, and forming the third photoresist-completely-reserved region and the third photoresist-completely-removed region through exposure and development with the mask, wherein the third photoresist-completely-removed region corresponds to the regions on both sides of the gate electrode and above the semiconductor active layer where the via holes are to be formed, and the third photoresist-completely-reserved region corresponds to the region above the third color filter layer other than the region where the via holes are to be formed;
removing the third color filter layer, the first color filter layer, the second color filter layer and the first protective layer in the third photoresist-completely-removed region through an etching process; and
stripping off the photoresist.

6. The fabrication method of the array substrate according to claim 3, wherein, forming via holes includes:
coating the photoresist on the third color filter layer, and forming the third photoresist-completely-reserved region and the third photoresist-completely-removed region through exposure and development with the mask, wherein the third photoresist-completely-removed region corresponds to the regions on both sides of the gate electrode and above the semiconductor active layer where the via holes are to be formed, and the third photoresist-completely-reserved region corresponds to the region above the third color filter layer other than the region where the via holes are to be formed;
removing the third color filter layer, the first color filter layer, the second color filter layer and the first protective layer in the third photoresist-completely-removed region through the etching process; and
stripping the photoresist.

7. The fabrication method of an array substrate according to claim 3, wherein, forming a pixel electrode and source and drain electrodes includes:
depositing a pixel electrode layer;
depositing a source and drain metal layer;
coating a photoresist, and forming a fourth photoresist-completely-reserved region, a fourth photoresist-partially-reserved region and a fourth photoresist-completely-removed region through exposure and development with a dual-tone mask, wherein the fourth photoresist-completely-reserved region corresponds to the via holes, the photoresist-partially-reserved region corresponds to a region of a portion of each of the first to third color filter layers that is not formed above the semiconductor active layer, the fourth photoresist-completely-removed region corresponds to a region of another portion of each of the first to third color filter layers that is not formed above the semiconductor active layer and a region in which the gate electrode, the gate insulating layer and the color filter layer are formed;

removing the pixel electrode layer and the source and drain metal layer in the fourth photoresist-completely-removed region through an etching process;

performing an ashing process to remove the photoresist in the fourth photoresist-partially-reserved region;

removing the source and drain metal layer in the region of the portion of each of the first to third color filter layers that is not formed above the semiconductor active layer through an etching process; and stripping off the photoresist.

8. A display device, including an array substrate fabricated by the fabrication method of an array substrate according to claim 1.

9. A fabrication method of an array substrate, including:
forming a semiconductor active layer, a gate insulating layer and a gate electrode on a substrate;
forming a light-shielding layer;
forming a first color filter layer and forming a second color filter layer;
forming a third color filter layer and forming via holes that respectively penetrate through the first color filter layer, the second color filter layer and the third color filter layers; and
forming a pixel electrode and source and drain electrodes, wherein, forming a pixel electrode and source and drain electrodes includes;
depositing a pixel electrode layer;
depositing a source and drain metal layer;
coating a photoresist, and forming a fourth photoresist-completely-reserved region, a fourth photoresist-partially-reserved region and a fourth photoresist-completely-removed region through exposure and development with a dual-tone mask, wherein the fourth photoresist-completely-reserved region corresponds to the via holes, the photoresist-partially-reserved region corresponds to a region of a portion of each of the first to third color filter layers that is not formed above the semiconductor active layer, the fourth photoresist-completely-removed region corresponds to a region of another portion of each of the first to third color filter layers that is not formed above the semiconductor active layer and a region in which the gate electrode, the gate insulating layer and the color filter layer are formed;
removing the pixel electrode layer and the source and drain metal layer in the fourth photoresist-completely-removed region through an etching process;
performing an ashing process to remove the photoresist in the fourth photoresist-partially-reserved region;
removing the source and drain metal layer in the region of the portion of each of the first to third color filter layers that is not formed above the semiconductor active layer through an etching process; and
stripping off the photoresist.

* * * * *